United States Patent
Cois

(10) Patent No.: US 10,242,828 B2
(45) Date of Patent: Mar. 26, 2019

(54) METHOD FOR MONITORING THE STATE OF THE EARTHING CONTACTS OF A CONTACTOR CONTROLLABLE BY MEANS OF AN EXCITER COIL

(71) Applicant: Robert Bosch GmbH, Stuttgart (DE)

(72) Inventor: Olivier Cois, Kernen (DE)

(73) Assignee: Robert Bosch GmbH, Stuttgart (DE)

( * ) Notice: Subject to any disclaimer, the term of this patent is extended or adjusted under 35 U.S.C. 154(b) by 270 days.

(21) Appl. No.: 15/300,870

(22) PCT Filed: Mar. 23, 2015

(86) PCT No.: PCT/EP2015/056049
§ 371 (c)(1),
(2) Date: Sep. 30, 2016

(87) PCT Pub. No.: WO2015/150131
PCT Pub. Date: Oct. 8, 2015

(65) Prior Publication Data
US 2017/0018384 A1    Jan. 19, 2017

(30) Foreign Application Priority Data
Apr. 4, 2014  (DE) .................. 10 2014 206 511

(51) Int. Cl.
*H01H 47/00* (2006.01)
*B60L 3/00* (2019.01)
(Continued)

(52) U.S. Cl.
CPC ......... *H01H 47/002* (2013.01); *B60L 3/0046* (2013.01); *B60L 3/04* (2013.01);
(Continued)

(58) Field of Classification Search
CPC ..... H01H 47/002; H01H 47/02; G01R 21/133
See application file for complete search history.

(56) References Cited

U.S. PATENT DOCUMENTS 5,742,032 A * 4/1998 Eke ................. H05B 6/6473
219/681
5,761,018 A   6/1998 Blakely
(Continued)

FOREIGN PATENT DOCUMENTS

CN    102412096 A    4/2012
DE    102004062266 A1    7/2006
(Continued)

OTHER PUBLICATIONS

International Search Report for Application No. PCT/EP2015/056049 dated Jun. 17, 2015 (English Translation, 2 pages).
(Continued)

*Primary Examiner* — Tung X Nguyen
*Assistant Examiner* — Dominic E Hawkins
(74) *Attorney, Agent, or Firm* — Michael Best & Friedrich LLP

(57) ABSTRACT

The present invention relates to a method for monitoring the state of the earthing contacts of a contactor controlled by an exciter coil, said contactor being operated as part of an isolation unit for galvanically isolating a voltage source from an electric consumer device connected to the voltage source, wherein a first power loss (22), which is transferred via the earthing contacts, and a second power loss (23), which is transferred via the exciter coil, are detected, and the first power loss (22) and the second power loss (23) are fed as input variables to a thermal model (21) of the contactor, the thermal model (21) determines an earthing contact temperature (24) according to at least one of the input variables and provides said contactor temperature as an output variable, and the provided earthing contact temperature (24) is evaluated.

10 Claims, 2 Drawing Sheets

(51) Int. Cl.
*B60L 3/04* (2006.01)
*G01R 31/327* (2006.01)
*B60L 11/18* (2006.01)
*G01K 7/42* (2006.01)
*G01R 21/133* (2006.01)
*H01H 47/02* (2006.01)
*H01H 71/04* (2006.01)

(52) U.S. Cl.
CPC .......... *B60L 11/1864* (2013.01); *G01K 7/427* (2013.01); *G01R 21/133* (2013.01); *G01R 31/3278* (2013.01); *H01H 47/02* (2013.01); *B60L 2240/36* (2013.01); *B60L 2240/547* (2013.01); *B60L 2240/549* (2013.01); *B60L 2270/145* (2013.01); *H01H 2047/009* (2013.01); *H01H 2047/025* (2013.01); *H01H 2071/044* (2013.01); *Y02T 10/7005* (2013.01); *Y02T 10/7061* (2013.01)

(56) References Cited

U.S. PATENT DOCUMENTS

| | | | | |
|---|---|---|---|---|
| 7,342,407 | B2* | 3/2008 | Kuwana | G01R 31/2874 324/750.02 |
| 9,594,118 | B2* | 3/2017 | Steck | G01R 31/3278 |
| 9,647,542 | B2* | 5/2017 | Schiff | H02M 3/156 |
| 2010/0150202 | A1* | 6/2010 | Asano | G01K 7/01 374/44 |
| 2010/0305857 | A1* | 12/2010 | Byrne | G06T 7/73 701/301 |
| 2011/0184941 | A1* | 7/2011 | El-Charif | G06F 17/30657 707/723 |
| 2013/0181793 | A1 | 7/2013 | Bauer et al. | |

FOREIGN PATENT DOCUMENTS

| | | | | |
|---|---|---|---|---|
| DE | 102010032456 | | 2/2012 | |
| DE | 102010041998 | A1 * | 4/2012 | ......... G01R 31/3278 |
| DE | 102011089996 | A1 | 6/2013 | |
| JP | 2006136161 | | 5/2006 | |
| WO | 2012045532 | | 4/2012 | |
| WO | WO-2012045532 | A1 * | 4/2012 | ......... G01R 31/3278 |

OTHER PUBLICATIONS

Demetriades et al., "A Real-Time Thermal Model of a Permanent Magnet Synchronous Motor," IEEE Transactions on Power Electronics, vol. 25, No. 2, Feb. 28, 2010, pp. 463-474.

* cited by examiner

METHOD FOR MONITORING THE STATE OF THE EARTHING CONTACTS OF A CONTACTOR CONTROLLABLE BY MEANS OF AN EXCITER COIL

BACKGROUND OF THE INVENTION

The invention relates to a method for monitoring the state of the earthing contacts of a contactor controlled by an exciter coil, said contactor being operated as part of an isolation unit for galvanically isolating a voltage source from an electric consumer device connected to the voltage source.

Contactors controllable by means of an exciter coil are known in various embodiments in the prior art. For example, the German printed publication DE 10 2010 032 456 A1 discloses an electric contactor comprising main and auxiliary contacts as earthing contacts. Such contactors are particularly used in battery systems of at least partially electrically operated vehicles in order if necessary, for example in the case of a fault in the battery of the battery system or a vehicle accident, to galvanically isolate the battery from the vehicle or from a charging device for recharging the battery, i.e from an electric consumer device.

In so doing, there is the problem that the contactor ages with every switching process, i.e the earthing contacts become more highly resistive. Besides the mechanical stress, the reasons for this ageing lie with the isolation processes. If a contactor isolates high currents or respectively high currents flow across the earthing contacts of the contactor, a so-called burn-off results, in particular when an electric arc is formed between the earthing contacts. Because the burn-off leads to a reduction in the contact material of the earthing contacts, said earthing contacts wear with time, which leads to a limited service life of such contactors and makes them more highly resistive. In order to ensure the complete functionality of an isolation unit, the contactor or the contactors of the isolation unit must therefore be replaced at certain temporal intervals. It is thereby desirable to know at which point in time the contactors should be replaced. In order to do this, a monitoring of the contactors is required.

In order to monitor the functionality of a contactor, it is known to check or respectively monitor whether the earthing contacts are still open. A common problem here is that an earthing contact once welded or partially welded as a result of an arc formation can loosen again, for example due to vehicle vibrations, and the contactor has then a high contact transition resistance without the monitoring recognizing this fact. The high transition resistance can then lead to a significant increase in temperature of the earthing contacts when the electric currents are high. Currents of for example 100 A up to 400 A (A: amperes) thus flow over the earthing contacts during a normal driving cycle. In the case of a current of 200 A and a contact transition resistance of 1 mΩ (mΩ: milliohm), a power loss of 40 W (W: Watts) is already transferred via the earthing contacts. In the case of a current of 400 A, the power loss even amounts to 160 W. The earthing contacts can thus greatly heat up when there is a high electric contact transition resistance and high currents, whereby the risk of a case of thermal failure increases.

A further known monitoring option is to count the number of contactor activations and to assume wear to the contactor at a predetermined number of contactor activations that would require a replacement of the contactor. A significant disadvantage with this is that the actual condition of the contactor is not taken into account and thus the contactor is generally replaced too early.

In the case of battery systems used in at least partially electrically operated vehicles, it is furthermore known to monitor the so-called pack voltage, i.e. that voltage which drops across the battery cells of the battery system that are electrically connected to one another, and the so-called link voltage, i.e. the voltage applied on the vehicle side, in order to thus be able to make assertions about the contactors connected therebetween.

In the light of the above, it is the aim of the present invention to improve a method for monitoring the state of the earthing contacts of a contactor controllable by means of an exciter coil in particular such that assertions about the quality of the state of the earthing contacts can be made in an improved manner and such that a determination can thus advantageously be made in an improved manner as to when the contactor can no longer be used or respectively should be replaced.

SUMMARY OF THE INVENTION

In order to meet this aim, a method is disclosed for monitoring the state of the earthing contacts of a contactor controlled by an exciter coil, said contactor being operated as part of an isolation unit for galvanically isolating a voltage source from an electric consumer device connected to the voltage source, wherein a first power loss, which is transferred via the earthing contacts, and a second power loss, which is transferred via the exciter coil, are detected, and the first power loss and the second power loss are fed as input variables to a thermal model of the contactor; the thermal model determines an earthing contact temperature according to at least one of the input variables and provides said contactor temperature as an output variable, and the provided earthing contact temperature is evaluated. Provision is particularly made for the contactor to be operated as part of an isolation unit for galvanically isolating a battery system from an electric consumer device connected to the battery system. In a particularly preferred manner, provision is made for the contactor to be operated in a hybrid, plug-in hybrid or electric vehicle as part of an isolation unit for galvanically isolating a traction battery of the vehicle from the vehicle and/or a charging station charging the traction battery.

The invention particularly utilizes the insight that the temperature of the earthing contacts is the direct measurement for the probability of a case of thermal failure occurring due to an increased contact transition resistance of the earthing contacts. An advantage of the present invention is that the current temperature of the earthing contacts does not have to be acquired with the help of temperature sensors. Instead, a thermal model is advantageously used with which assertions are made about the earthing contact temperature. By means of an evaluation of the earthing contact temperature determined according to the invention, in particular by carrying out a comparison of the determined earthing contact temperature with at least one predefined temperature threshold value, the invention advantageously makes it possible to counteract in a timely manner the occurrence of a thermal failure. This can, for example, take place by generating a signal, which indicates the need to replace the contactor and/or to limit the arising currents.

In an advantageous manner, the first power loss is detected by the voltage dropping at the voltage source and the voltage dropping upstream of the electric consumer being acquired using measuring technology. The voltage dropping across the earthing contacts is ascertained by subtracting these voltages. The result is then multiplied by the current flowing across the earthing contacts, which is likewise acquired using measuring technology. In order to determine the second power loss, provision is particularly made for the voltage dropping across the exciter coil to be acquired using measuring technology and the current flowing through the exciter coil to be acquired using measuring technology and for the second power loss to be determined by multiplying the values acquired in each case. The thermal model thereby advantageously utilizes the relationship between power loss and heat dissipation.

According to one advantageous embodiment of the method according to the invention, provision is made for a correction variable to be fed as an additional input variable to the thermal model, said correction variable being taken into account when determining the earthing contact temperature by means of the thermal model. As a result, an even more exact determination of the earthing contact temperature is hereby advantageously facilitated.

According to one preferred embodiment of the method according to the invention, the thermal model determines a first exciter coil temperature according to at least one of the input variables, in particular according to the first power loss and the second power loss and provides the same as an additional output variable. In addition, a second exciter coil temperature is advantageously determined independently of the thermal model, wherein a difference is formed between the first exciter coil temperature and the second exciter coil temperature. This difference between the first exciter coil temperature and the second exciter coil temperature is then advantageously fed as a correction variable to the thermal model. In principle, the first exciter coil temperature and the second exciter coil temperature relate to the same exciter coil temperature. The differentiation between first exciter coil temperature and second exciter coil temperature can be attributed in this respect to the different ways of determining the exciter coil temperature. At least slight deviations to the first exciter coil temperature determined at a point in time and to the second exciter coil temperature determined at the same point in time occur due to the different ways of determining said exciter coil temperature. The thermal model determines the exciter coil temperature and the earthing contact temperature preferably according to the so-called observer principle.

According to another advantageous embodiment of the method according to the invention, the electrical resistance of the exciter coil is determined and the second exciter coil temperature is determined as a function of the determined resistance. To this end, provision is particularly made for the resistance of the coil to be determined by dividing the exciter coil current by the exciter coil voltage. In so doing, use is made of the fact that the exciter coil temperature is dependent on the electrical resistance of the exciter coil. An assertion is therefore advantageously made about the exciter coil temperature via the resistance value of the exciter coil.

Provision is particularly made for an exciter coil voltage, which drops across the exciter coil, and an exciter coil current, which flows through the exciter coil, to be determined and for the exciter coil voltage and the exciter coil current to be fed as input variables to a resistance model. The resistance model then advantageously determines an exciter coil resistance from the provided input variables. The resistance model further advantageously determines the second exciter coil temperature as a function of the exciter coil resistance and provides the same as an output variable.

Provision is particularly made for the resistance model to be initially calibrated offline. The input variables of the resistance model are advantageously varied and the exciter coil temperatures occurring in each case are acquired using measuring technology. That means that the resistance model is advantageously calibrated prior to said resistance model being used for monitoring the state of the earthing contacts. Provision is particularly made for the values to be stored in the form of a so-called look-up table. The relationship between resistance value of the exciter coil and exciter coil temperature is advantageously determined by the calibration. That means that the second exciter coil temperature determined as an output variable from the resistance model is a function of the determined resistance measured values. The resistance model is preferably implemented as a sequence of instructions executable by means of a computing unit, in particular a sequence of instructions executable by means of a microcontroller.

According to a further advantageous embodiment of the invention, the thermal model is initially calibrated offline. The operating parameters, in particular the first power loss and/or the second power loss, are thereby advantageously varied and the earthing contact temperatures occurring in each case or the earthing contact temperatures and exciter coil temperatures occurring in each case are acquired using measuring technology. In this case, the calibration takes place across the entire ambient temperature range, i.e across the whole range of temperatures which can realistically occur as ambient temperatures during the operation of a contactor. The thermal model is preferably designed as a stationary MIMO model (MIMO: multiple input/multiple output).

Provision is particularly made for the parameters which influence the first power loss and/or the second power loss to be varied. Provision is preferably made for electric voltages and/or electric currents influencing the first power loss and/or the second power loss as operating parameters to be varied.

Earthing contact temperatures and/or exciter coil temperatures acquired within the scope of the calibration together with the operating parameters set thereby in each case and/or set input variables are advantageously stored as values and said values are associated with each other. That means the earthing contact temperatures acquired using measuring technology and/or the first exciter coil temperatures acquired using measuring technology are in each case advantageously associated with the operating parameters set or respectively prevailing during a measurement. These values are then advantageously merged into the respective model, i.e into the thermal model and/or the resistance model, preferably in the form of a look-up table. This advantageously occurs in such a way that an earthing contact temperature can be determined via the corresponding association by means of the thermal model consisting of a first determined power loss and a second determined power loss. The thermal model is preferably implemented as a sequence of instructions executable by means of a computing unit, in particular as a sequence of instructions executable by means of a microcontroller.

The method according to the invention thus advantageously makes it possible for the input variables of the thermal model and the resistance model to be substantially continuously determined online during operation and for the calibrated thermal model to especially provide the earthing contact temperature of interest advantageously without using temperature sensors in the process.

According to a further advantageous embodiment of the method according to the invention, provision is made for the evaluation of the provided earthing contact temperature to comprise a threshold value comparison, wherein an action is triggered when a predefined threshold value has been exceeded. An action is particularly the generating of a warning and/or a power reduction and/or an opening of the earthing contacts. Provision is furthermore especially made for the earthing contact temperature determined from the thermal model to be transmitted to at least one further device, in particular to a vehicle control unit (VCU). Furthermore, provision is especially made for the determined earthing contact temperature to be visualized, in particular as user information, particularly preferably when using the method according to the invention in a hybrid, plug-in hybrid or electric vehicle.

BRIEF DESCRIPTION OF THE DRAWINGS

Further advantageous details, features and embodiment details of the invention are explained in detail in connection with the exemplary embodiments depicted in the figures of the drawings. In the drawings.

DETAILED DESCRIPTION

Figure 1:
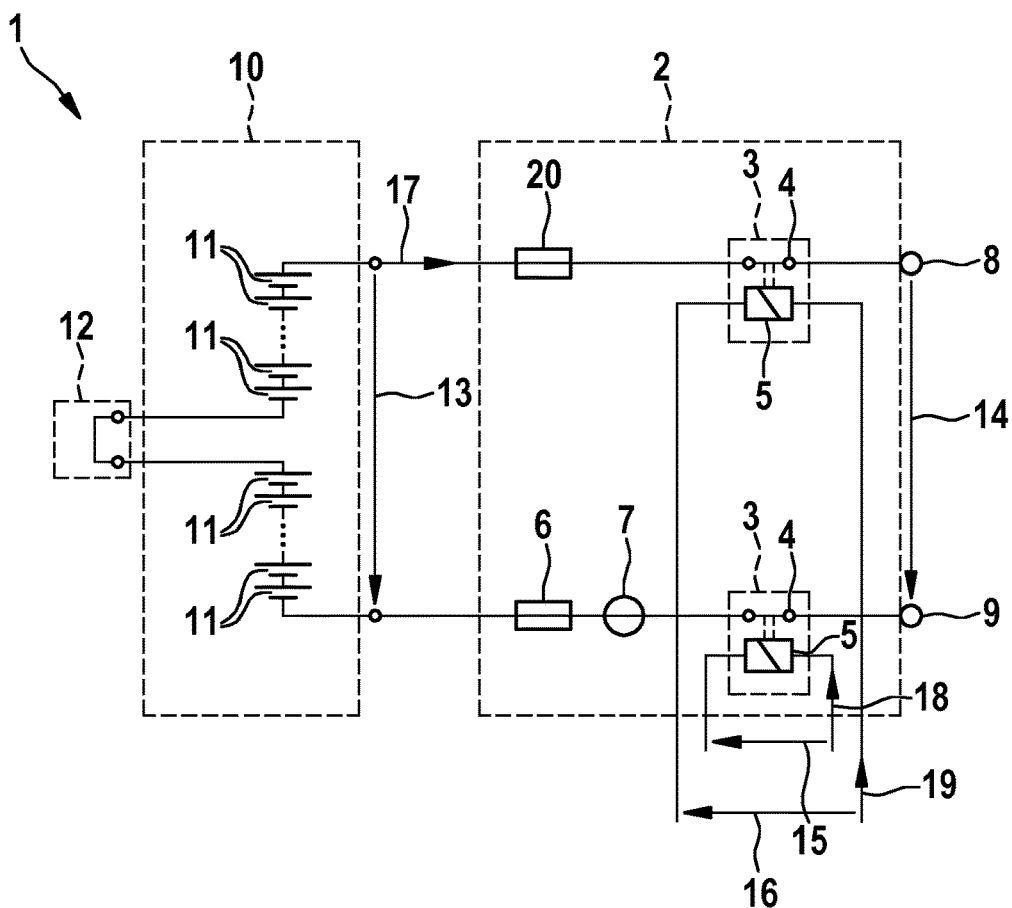
FIG. 1 shows a battery system known in the prior art, in which contactors are operated as part of an isolation unit.

The battery system 1 depicted in FIG. 1 comprises a traction battery 10 having a plurality of battery cells that are electrically connected to one another. In addition, the traction battery 10 comprises a service plug 12. In order, in case of emergency, to be able to galvanically isolate the traction battery 10 at all of the poles from a consumer device (not explicitly depicted in FIG. 1), in particular a vehicle or a charging device for charging said traction battery 10, the battery system 1 comprises an isolation unit 2 for galvanically isolating said traction battery 10 from the consumer device.

The isolation unit comprises two contactors 3 controllable in each case by means of an exciter coil 5. The contactors 4 open in the case of a fault and thus galvanically isolate the traction battery 10 from a consumer device connected to said traction battery 10 via the connection terminals 8, 9. Besides the contactors 3, the isolation unit 2 comprises a first current sensor 6, which is designed as a shunt, and a second current sensor 7, which is designed as a Hall sensor. In addition, the isolation unit 2 comprises a current interruption device 20, which is designed as a fuse in the present example.

With the aid of the battery system 1 depicted in FIG. 1, particularly those operating parameters are depicted which are advantageously acquired from the contactors 3 when carrying out a method according to the invention for monitoring the state of the earthing contacts 4. This is preferably the voltage 13 applied to the traction battery 10, which is also known as pack voltage. Furthermore, this is the further voltage 14 applied downstream of the isolation unit 2, i.e. on the vehicle side, said further voltage also being referred to as link voltage. In addition, the current 17, also denoted as pack current, is acquired using measuring technology. Moreover, the currents 18, 19 flowing through the respective exciter coil 5 are advantageously acquired using measuring technology. The voltages 15, 16 dropping across the respective exciter coil 5 are likewise acquired using measuring technology.

Figure 2:
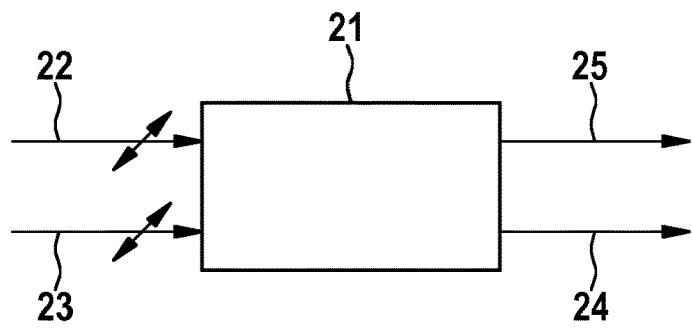
FIG. 2 shows a simplified block diagram of an exemplary embodiment for a thermal model used when carrying out a method according to the invention.

In order to obtain an assertion about the earthing contact temperature, a thermal model of the respective contactor 3 is initially created. Such a model is depicted in principle in FIG. 2. The thermal model 21 depicted in FIG. 2 is designed as a stationary MIMO model (MIMO: multiple input/multiple output). Input variables of the thermal model 21 depicted in FIG. 2 are a first power loss 22, which is transferred via the earthing contacts 4 of a contactor 3 (cf. FIG. 1), and a second power loss 23, which is transferred via the exciter coil 5 (cf. FIG. 1). Output variables of the thermal model 21 are an earthing contact temperature 24 determined by means of the thermal model 21 and a first exciter coil temperature 25 determined by means of the thermal model 21.

The first power loss is advantageously detected by the pack voltage 13 (cf. FIG. 1) being acquired using measuring technology, the link voltage 14 (cf. FIG. 1) being acquired using measuring technology and the pack current 17 (cf. FIG. 1) being acquired using measuring technology. In so doing, the voltage dropping across the earthing contacts 4 is ascertained by subtracting the link voltage 14 from the pack voltage 13; and the ascertained value is multiplied by the value ascertained for the pack current 17.

In order to determine the second power loss, the respective coil current 18, 19 (cf. FIG. 1) is acquired using measuring technology. And the respective coil voltage 15, 16 (cf. FIG. 1) is acquired using measuring technology. The second power loss is then determined for a contactor 3 by the value for the ascertained coil voltage 15 being multiplied by the value for the ascertained coil current 18, or respectively the value for the ascertained coil voltage 16 being multiplied by the value for the ascertained coil current 19.

The thermal model 21 is initially calibrated offline, i.e. prior to earthing contact temperatures 24 being determined by means of the thermal model 21. Within the scope of the calibration, the operating parameters, i.e. particularly the pack current 17 (cf. FIG. 1), the respective exciter coil current 18 or 19 (cf. FIG. 1) as well as the exciter coil voltages 15 or 16 (cf. FIG. 1), are varied. In addition, the pack voltage 13 (cf. FIG. 1) and the link voltage 14 (cf. FIG. 1) are varied. The earthing contact temperature ensuing in each case and the exciter coil temperature ensuing in each case are thereby likewise acquired using measuring technology for the operating parameter combination set or prevailing in each case and are associated with the respective values of the operating parameters. Provision is particularly made for a look-up table to be created to this end. The thermal model 21 then checks the input variables in the corresponding look-up table and provides the associated values which are deposited for the earthing contact temperature and the exciter coil temperature and provides the same as output variables 24, 25.

An exemplary arrangement is listed below:

| Measured Variable | Normal Case | Case of a Fault |
| --- | --- | --- |
| $R_{contact}/m\Omega$ | 0.2 | 0.8 |
| $U_{contact}/mV$ | 43 | 172 |
| $I_{pack}/A$ | 215 | 215 |

| Measured Variable | Normal Case | Case of a Fault |
|---|---|---|
| $P_{elec}$/W | 9.245 | 37 |
| $T_{contact}$/° C. | 100 | 250 |
| $T_{coil}$/° C. | 50 | 125 |
| $R_{coil}$/Ω | 3.58 | 4.5 |
| $U_{coil}$/V | 7.5 | 7.5 |
| $I_{coil}$/A | 2.1 | 3 |
| $P_{coil}$/W | 15.8 | 40.5 |

In this context:

$R_{contact}$: the contact transition resistance at the earthing contacts;
$U_{contact}$: the voltage falling across the earthing contacts;
$I_{pack}$: the pack current;
$P_{elec}$: the first power loss;
$T_{contact}$: the earthing contact temperature;
$T_{coil}$: the exciter coil temperature;
$R_{coil}$: the resistance of the exciter coil;
$U_{coil}$: the exciter coil voltage;
$I_{coil}$: the exciter coil current; and
$P_{coil}$: the second power loss.

Figure 3:
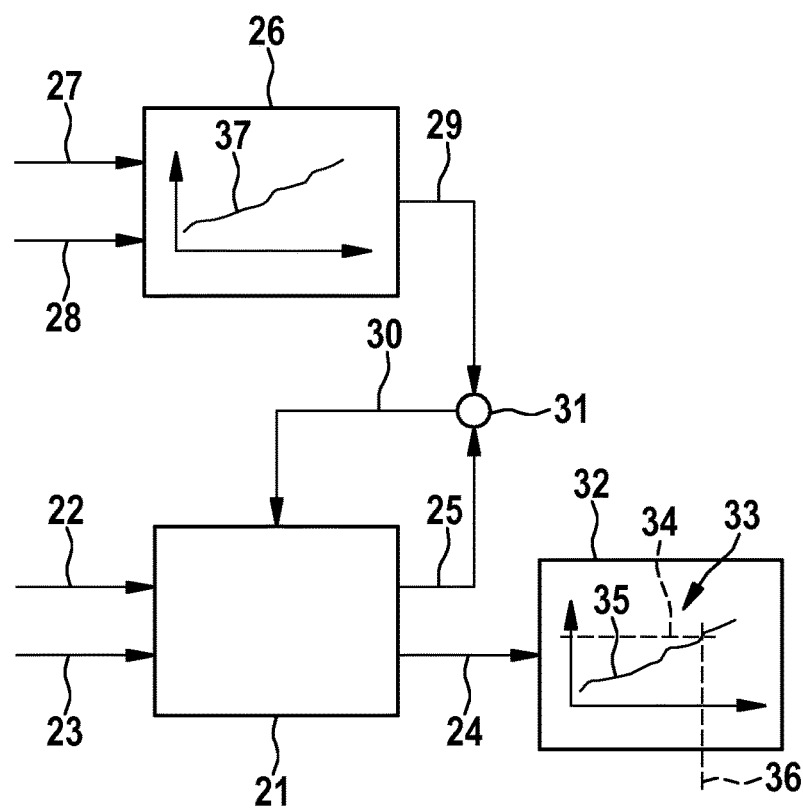
FIG. 3 shows a simplified block diagram for explaining an exemplary embodiment for an inventive method for monitoring the state of the earthing contacts of a contactor controllable by means of an exciter coil.

An advantageous exemplary embodiment for a method according to the invention is explained in detail with the aid of FIG. 3. A first power loss 22, which is transferred via the earthing contacts, and a second power loss 23, which is transferred via the exciter coil, are initially detected in the exemplary embodiment for a method according to the invention for monitoring the state of the earthing contacts of a contactor controllable by means of an exciter coil, said contactor being operated as part of an isolation unit for galvanically isolating a voltage source from an electric consumer device connected to the voltage source. The first power loss 22 and the second power loss 23 are fed as input variables to a thermal model 21 of the contactor. The first power loss 22 and second power loss 23 used in each case as input variables are determined online substantially continuously and the calibrated thermal model 21 additionally provides the earthing contact temperature 24 without having to use temperature sensors to detect the earthing contact temperature 24. The thermal model 21 can thereby be calibrated, in particular as in the connection with FIG. 2.

A correction variable 30 is fed as a further input variable to the thermal model 21. In so doing, the thermal model 21 determines an earthing contact temperature 24 and a first exciter coil temperature 25 according to the observer principle as a function of the first power loss 22 and the second power loss 23 and while taking into account the correction variable 30 and provides said earthing contact temperature 24 and said first exciter coil temperature 25 in each case as output variables.

A second exciter coil temperature 29 is determined by means of a resistance model 26 and is provided as an output variable of the resistance model 26. Provision is thereby particularly made for an exciter coil voltage 27, which drops across the exciter coil of the contactor, and an exciter coil current 28, which flows through the exciter coil of the of the contactor, to be acquired using measuring technology and for the exciter coil voltage 27 and the exciter coil current 28 to be fed as input variables to the resistance modal 26. The resistance model 26 calculates an exciter coil resistance from the supplied input variables by the exciter coil voltage being divided by the exciter coil current.

In an advantageous manner, the resistance model 26 has initially been calibrated offline, i.e. prior to determining second exciter coil temperatures by means of the resistance model 26. In so doing, provision is particularly made for the input variables of the resistance model 26 to be varied at different ambient temperatures and for the exciter coil temperatures occurring in each case to be respectively acquired using measuring technology. As a result, an association of an exciter coil temperature with a determined resistance of the exciter coil is finally advantageously facilitated. In FIG. 3, the profile of the exciter coil temperature is depicted in a temperature unit as a function of the resistance of the exciter coil.

In the exemplary embodiment for the method according to the invention, the correction variable 30 is generated from first exciter coil temperature, which was determined from the thermal model 21, and the second exciter coil temperature 29, which was determined from the resistance model 26, by the second exciter coil temperature 29 being subtracted from the first exciter coil temperature 25 via a subtractor. The fact that the correction variable 30 is taken into account by the thermal model 21 advantageously leads to an even more exact determination of the earthing contact temperature 24.

The earthing contact temperature 24 determined from the thermal model 21 and provided as an output variable is evaluated by the earthing contact temperature 24 being fed to a comparator unit 32, which carries out a threshold value comparison 33. To this end, an earthing contact temperature profile 35 in a temperature unit is depicted over the time in FIG. 3 with the symbolically depicted comparator unit 32. If the earthing contact temperature exceeds a certain threshold value 34 for the earthing contact temperature, as is depicted in FIG. 3 symbolically at a point in time 36, an action is then triggered. Provision is particularly made for a warning to be generated and for a need to replace the contactor to be indicated. In addition, provision is made for an action that the power provided by means of the voltage source to be reduced if a predefined threshold value 34 has been exceeded. If a maximally admissible threshold value for the earthing contact temperature is exceeded, provision is therefore made for the contactors to open in order to galvanically isolate the voltage source from a consumer device connected to the voltage source.

If the method according to the invention is used in a hybrid, plug-in hybrid or an electric vehicle, provision is particularly made for suitable corrective measures to be introduced if the earthing contact temperature determined from the thermal model 21 exceeds temperature threshold values. A triggering of an alarm, a reduction of the power delivered by the battery system and/or an opening of the earthing contacts and therefore a shutting down of the vehicle are particularly provided as corrective measures. The battery system power is advantageously reduced automatically or manually by the operator of the vehicle. The alarm is preferably triggered only automatically and also leads in a preferred manner to automatically shutting down the vehicle. A so-called limp-home mode is particularly provided, in which the driver recognizes when he/she has to reduce the battery system power such that he/she can still travel a certain distance with the vehicle.

Figure 4:
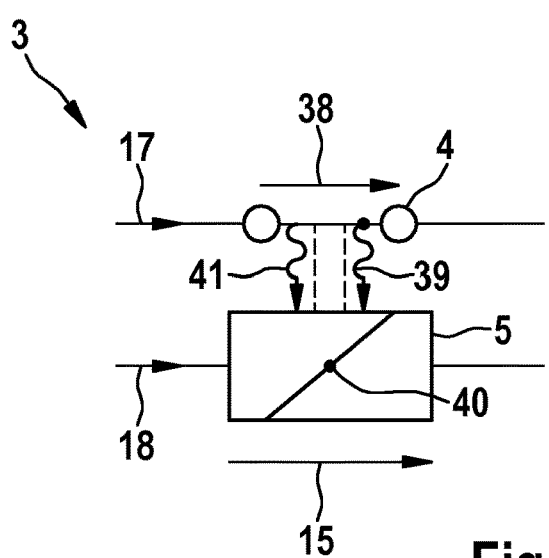
FIG. 4 shows an exemplary embodiment for a contactor in a schematic depiction.

In FIG. 4, an exemplary embodiment is depicted for a contactor 3 situated in operation, wherein the earthing contacts 4 are closed. The contactor 3 can thereby be controlled by means of an exciter coil 5. That means an opening and closing of the earthing contacts 4 are controlled by means of the exciter coil 5.

In order to hold the earthing contacts 4 in the closed position, an exciter current 18 flows through the exciter coil 5 and the exciter coil voltage 15 drops. The pack current 17 then flows across the earthing contacts 4 and the voltage 38 drops across the earthing contacts. These variables are advantageously varied at different ambient temperatures in order to calibrate a thermal model 21 (cf. FIG. 2 and FIG. 3), wherein different exciter coil temperatures and earthing contact temperatures occur depending on the setting of the operating temperatures. In FIG. 4, the temperature inputs of the earthing contacts 4 into the exciter coil 5 are depicted schematically by the arrows 39 and 41. The exciter coil temperature occurring at concrete values of the operating parameters is detected by means of a measurement sensor 40 using measuring technology. The earthing contact temperature is likewise detected using measuring technology.

The exemplary embodiments depicted in the figures and explained in connection with said figures are used to explain the invention are not meant to limit said invention.

The invention claimed is:

1. A method for monitoring the state of earthing contacts (4) of a contactor (3) controllable by an exciter coil (5), said contactor operated as part of an isolation unit (2) for galvanically isolating a voltage source from an electric consumer device connected to the voltage source, the method comprising:
    calculating a first power loss (22), transferred via the earthing contacts (4) by a computing unit subtracting a measured link voltage (14) from a measured pack voltage (13); and multiplying the difference by a measured pack current (17), and
    calculating a second power loss (23), transferred via the exciter coil (5) by the computing unit multiplying a measured coil voltage (15, 16) by a measured coil current (18, 19),
    feeding the first power loss (22) and the second power loss (23) as input variables to a thermal model (21) of the contactor (3),
    the thermal model (21) determining an earthing contact temperature (24) based on at least one of the input variables and provides said earthing contact temperature as an output variable, and the provided earthing contact temperature (24) is evaluated.

2. The method according to claim 1, wherein a correction variable (30) is fed as a further input variable to the thermal model (21), said correction variable being taken into account when the thermal model (21) determines the earthing contact temperature (24).

3. The method according to claim 1, wherein the thermal model (21) determines a first exciter coil temperature (25) according to at least one of the input variables and provides said exciter coil temperature as a further output variable and that a second exciter coil temperature (29) is determined independently of the thermal model (21), wherein a difference is formed between the first exciter coil temperature (25) and the second exciter coil temperature (29), and the difference is fed as a correction variable (30) to the thermal model.

4. The method according to claim 3, wherein the electrical resistance of the exciter coil (5) is determined and the second exciter coil temperature (29) is determined as a function of the determined resistance.

5. The method according to claim 3, wherein an exciter coil voltage (27), which drops across the exciter coil (5), and an exciter coil current (28), which flows through the exciter coil (5), are determined; the exciter coil voltage (27) and the exciter coil current (28) are fed as input variables to a resistance model (26); the resistance model (26) determines an exciter coil resistance from the supplied input variables, and the second exciter coil temperature (29) is determined as a function of the exciter coil resistance and is provided as an output variable.

6. The method according to claim 5, wherein the resistance model (26) is initially calibrated offline, wherein the input variables of the resistance model (26) are varied and the exciter coil temperatures occurring in each case are acquired using measuring technology.

7. The method according to claim 1, wherein the thermal model (21) is initially calibrated offline, wherein operating parameters are varied and the earthing contact temperatures occurring in each case or the earthing contact temperatures occurring in each case and the exciter coil temperatures are acquired using measuring technology.

8. The method according to claim 7, wherein the electric voltages and/or electric currents influencing the first power loss (22) and/or the second power loss (23) as operating parameters are varied.

9. The method according to claim 5, wherein earthing contact temperatures and/or exciter coil temperatures acquired within the scope of the calibration together with the operating parameters and/or the input variables set thereby in each case are stored as values, and said values are associated with one another.

10. The method according to claim 1, wherein the evaluation of the provided earthing contact temperature (24) comprises a threshold value comparison (33), wherein an action is triggered when a predefined threshold value (34) has been exceeded (36).

* * * * *